United States Patent [19]
Kim

[11] 3,965,437
[45] June 22, 1976

[54] AVALANCHE SEMICONDUCTOR AMPLIFIER

[75] Inventor: Chung Kyu Kim, Lexington, Mass.

[73] Assignee: Raytheon Company, Lexington, Mass.

[22] Filed: Aug. 26, 1974

[21] Appl. No.: 500,973

Related U.S. Application Data

[60] Continuation of Ser. No. 360,716, May 16, 1973, which is a division of Ser. No. 291,483, Sept. 22, 1972, abandoned, which is a continuation of Ser. No. 133,642, April 13, 1971, abandoned.

[52] U.S. Cl. .................................. 330/34; 357/65; 357/68; 357/69
[51] Int. Cl.² .......................................... H03F 3/10
[58] Field of Search .................. 330/34; 331/107 R; 333/1.1; 317/235 UA; 357/65, 68, 69

[56] References Cited
UNITED STATES PATENTS

| | | | |
|---|---|---|---|
| 3,387,359 | 6/1968 | Dale et al. | 357/65 X |
| 3,490,051 | 3/1970 | Hakki et al. | 330/34 X |
| 3,628,187 | 12/1971 | Deloach, Jr. | 331/107 R |

OTHER PUBLICATIONS

Electronic Design, p. 120, Apr. 12, 1967.
Solid State Electronics, Kim et al., pp. 53–55, Jan. 1970.
Proceedings of IEEE–LEE et al., pp. 1153, 1154, July, 1970.
Electronic Design, p. 28, Nov. 22, 1970.

*Primary Examiner*—R. V. Rolinec
*Assistant Examiner*—Lawrence J. Dahl
*Attorney, Agent, or Firm*—John R. Inge; Joseph D. Pannone; Milton D. Bartlett

[57] ABSTRACT

A microwave semiconductor amplifier or oscillator system in which a semiconductor device has an avalanching region at a junction and a heat sink having a higher thermal conductivity than said avalanching region in close thermal contact with the said junction. The avalanching region has a width substantially less than ten times the thickness of said avalanching region but a length substantially greater than said width. The heat sink is made substantially wider than that of the avalanching region so that heat generated in the avalanching region during operation of the system and moving into the heat sink will have a substantial component thereof moving parallel to the junction, thereby decreasing the thermal resistance between the heat source and the heat sink and hence permitting an increased power output from the system. The thermal resistance between the avalanching region and the heat sink is further reduced by the use of a Schottky type junction in which a thin layer of platinum is deposited on gallium arsenide N type semiconductor material and a gold heat sink is deposited on the platinum layer.

12 Claims, 5 Drawing Figures

AVALANCHE SEMICONDUCTOR AMPLIFIER

CROSS REFERENCE TO RELATED APPLICATIONS

This is a continuation of application Ser. No. 360,716 filed May 16, 1973, which is a division of application Ser. No. 291,483 filed Sept. 22, 1972 (now abandoned) as a continuation of application Ser. No. 133,642 filed Apr. 13, 1971 (now abandoned).

BACKGROUND OF THE INVENTION

Microwave systems using bulk semiconductor properties and/or junction characteristics such as avalanche diodes, bulk effect diodes or Gunn diodes can be designed to work at frequencies generally above those economically feasible or practical for transistors. However, such devices generate substantial amounts of heat in the semiconductor body and the average power output is limited by the rate at which such heat can be removed.

SUMMARY OF THE INVENTION

This invention provides for increasing the power output and/or efficiency of microwave semiconductor devices by lowering the thermal resistance between the source of heat in the semiconductor region of a semiconductor junction device and a heat sink having a higher thermal conductivity than said semiconductor region. The term "semiconductor junction device" as used herein is intended to include all devices in which an energy level gap exists between two adjacent regions of the device. Since the power output of such devices is limited by the maximum power input which can be applied to the device without overheating, increasing the rate at which heat will flow out of the heat producing semiconductor region increases the maximum average power input and, therefore, increases the maximum average power output.

In addition, such a power increase in some semiconductor junction devices, such as some avalanche devices operating in the TRAPATT oscillation mode, allows an increase in efficiency since the current densities necessary for maximum efficiency, which can exceed 40%, have required intermittent or pulsed operation and by increasing the heat dissipation, the pulse length can be made longer or, if desired, such TRAPATT mode devices can be made to operate efficiently as substantially continuous wave devices.

More specifically, the invention provides for the use of substantially extended junctions in which one transverse dimension, which may be referred to as the width, of the active or avalanching region where the major portion of the heat is generated, is made substantially less than ten times the thickness of the said region. The junction adjacent to the avalanching region is positioned in intimate thermal contact with a heat sink which extends substantially beyond, or is substantially wider than, said active region.

In addition, it has been found that the thermal resistance may be substantially reduced by forming a junction with a thin layer of material contacting a semiconductor body. The layer may be metal, semiconductor material of the kind as said body or of a different kind and/or any other desired material which will form a junction with said body and to which a good thermal bond may be made. A heat sink is formed by plating a material having a higher thermal conductivity than said layer onto said thin layer. Since some metals such as gold which will act as good heat conductors may at elevated temperatures diffuse into the semiconductor body, the thin layer of material used to form the junction may also be used as a diffusion barrier. For example, if the semiconductor body is N type gallium arsenide doped, for example, with tellurium, the diffusion barrier layer may be platinum.

This invention further discloses that the device may be formed by epitaxially growing a layer of semiconductor material on a semiconductor substrate, forming a barrier junction, plating a heat sink of sufficient thickness to provide a low thermal resistance heat dissipation path onto the barrier layer, and removing the semiconductor material on the opposite side of the junction to reduce the thickness of the semiconductor body so that the major portion of said body will be utilized as an active or avalanching region. The opposite surface of the semiconductor body from that used to form the barrier junction is then coated with metal and selected portions of said metal and the underlying semiconductor body adjacent to the active region are then removed by etching. This metal layer may be an evaporated layer of gold over an evaporated layer of platinum, which will form a barrier junction with the gallium arsenide if the entire gallium arsenide body is N doped. However, since this junction is normally forward biased and hence has a low resistance during operation of the system.

This invention also discloses that the resistance through the gallium arsenide body, which reduces gain and efficiency, can be reduced by the use of a heavily doped or N+ region on the opposite side of the avalanche region of the semiconductor body from that adjacent to the plated heat sink. Since the N+ region is low resistance, its thickness is less critical than the thickness of the N−, or avalanche, region. Accordingly this invention discloses that the thickness of the N− layer may be closely controlled by epitaxially growing the N− layer on a substrate of N+ material. The N− layer has a thickness and carrier density sufficient to avalanche when a reverse bias voltage is applied across the junction formed with said N− region without the depletion regions extending into, or punching through to, the N+ region.

A DC potential is maintained between the metal layers on the opposite sides of the semiconductor material whose polarity back biases the junction adjacent the heat sink and causes space charge to extend from the back bias junction into the semiconductor body. The potential is preferably supplied from a constant current source such that the voltage back bias on the junction will increase until avalanching and amplification occur. The avalanche region may amplify and input signal from an external microwave source if the device is used as an external signal amplifier or as an oscillator.

Since such devices have a relatively low impedance at microwave frequencies, it is desirable that the opposing metal layers, which may be regarded as a parallel plate capacitance, be kept to the minimum necessary for maintenance of the DC field within the semiconductor body by removing the unused regions of semiconductor material.

BRIEF DESCRIPTION OF THE DRAWINGS

Other and further objects and advantages of the invention will become apparent as the description thereof progresses, reference being had to the accompanying drawings wherein.

DESCRIPTION OF THE PREFERRED EMBODIMENT

Figure 1:
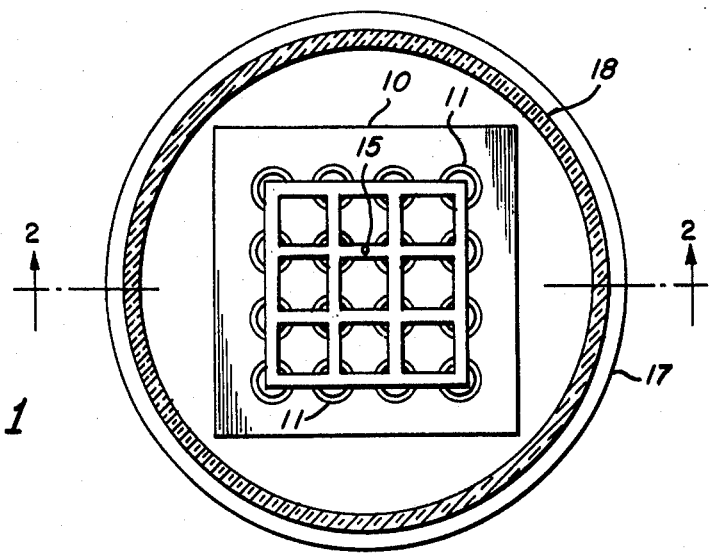
FIG. 1 illustrates a top plan view of a semiconductor device embodying the invention.
Figure 2:
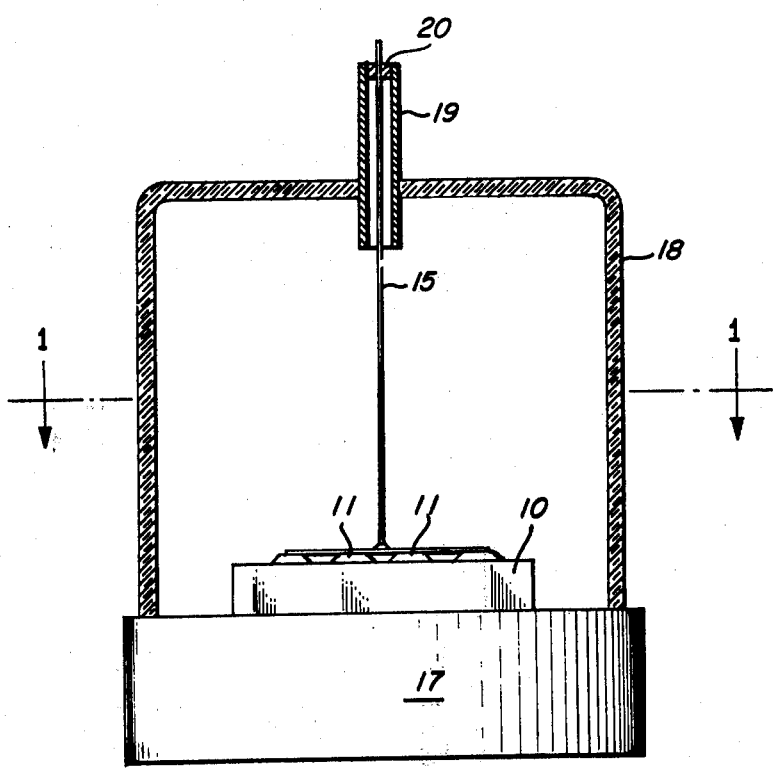
FIG. 2 illustrates a transverse partial sectional view of the device illustrated in FIG. 1 taken along line 2—2 of FIG. 1.
Figure 3:
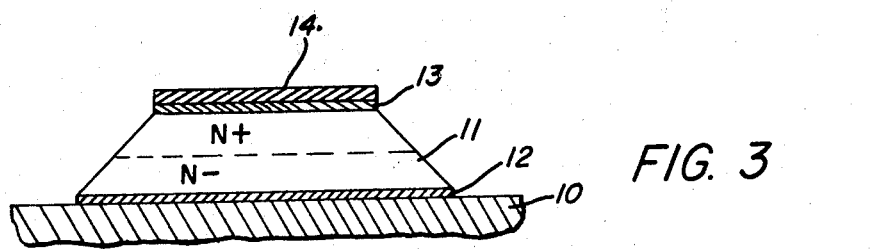
FIG. 3 illustrates an expanded view of one of the junction regions shown in FIG. 2.

Referring now to FIGS. 1 through 3, there is shown a flat slab 10 which may be, for example, of any good thermal conductive material such as gold. For a device having a few watts of output, slab 10 may be, for example, 7 to 10 mils thick and be, for example, in the form of a square 65 mils on a side. Supported by slab 10 is a semiconductor body 11 which may be of any desired material, such as gallium arsenide, silicon or indium phosphide. As indicated herein, semiconductor body 11 has a thickness of around 10 microns and a smallest traverse dimension along the heat sink slab 10, or width at the heat sink of approximately 50 microns. Positioned between semiconductor body 11 and the heat sink 10 is a thin layer of metal 12 which forms a Schottky barrier junction with the semiconductor body 11. Many materials may be used for the layer 12, the specific material, disclosed herein by way of example only, being platinum approximately 0.4 microns thick.

The region of the semiconductor body 11 adjacent the heat sink 12 is an N− region having a high resistivity of, for example, $10^{14}$ to $5 \times 10^{17}$ carriers per cubic centimeter produced by doping the semiconductor body with an N type impurity. This region may be, for example, 5 to 10 microns thick depending on the carrier concentration and is preferably made thick enough that avalanching will occur in this region without the space charge produced by a back bias potential across the junction extending outside of the N− region. On the opposite side of the N− region from platinum layer 12 is an N+ region with a carrier concentration on the order of $10^{18}$ carriers per cubic centimeter or greater.

The N+ region has a layer 13 of platinum thereon, for example, 0.3 microns thick, which forms a junction with the N+ region. However, this junction will normally be low resistance since it is forward biased during operation. Formed on layer 13 is a layer 14 which may be, for example, of gold having a thickness, for example, of 0.6 microns. The platinum layers 12 and 13 prevent diffusion of the gold from slab 10 or layer 14 into the gallium arsenide body 11.

The body 11, is shown herein by way of example only, as a configuration of two series of four elongated regions intersecting each other in mutually orthogonal directions, each region having a width of approximately 2 mils or 50 microns and a length of approximately 50 mils so that only a few percent of the total surface area of the slab 10 is covered by the semiconductor material. Due to the elongated configuration, heat, which would otherwise flow a substantial portion of the substantially entirely in a direction normal to the surface of the slab 10, will flow in directions having components parallel to the slab 10, thereby increasing the total heat flow for a given temperature gradient between body 11 and slab 10. This may, if desired, be regarded as reducing the thermal resistance between the source of heat in the N− region of the semiconductor body and the slab 10 through which heat is extracted from the device either by radiation to the air or by contact with a solid heat sink or a fluid.

Slab 10 is mounted on a package base 17 which is preferably of metal and to which is sealed an envelope 18 which may be of glass or ceramic. Extending through envelope 18 is a tubular metal member 19 through which a lead-in conductor 15 conducts input power to the layer 14. The package is closed by sealing conductor 15 to member 19 by a solder seal 20 at the outer end of member 19. This package is illustrated by way of example only, and any desired conventional packaging arrangement could be used.

Method of Forming the Preferred Embodiment

A wafer of gallium arsenide a few mils thick is sliced from a grown crystal of gallium arsenide doped with sulphur to a carrier concentration on the order of $10^{18}$ carriers per cubic centimeter, hereinafter referred to as N+ material. A layer of gallium arsenide doped with tellurium to a carrier concentration in the range of $10^{14}$ to $5 \times 10^{17}$ carriers per cubic centimeter, is epitaxially grown on one surface of the N+ slice by any desired epitaxial processes to form an N− layer having a substantially higher resistance layer than the N+ layer and a thickness of 5 to 10 microns. The thickness and carrier concentration of the N− layer is selected in accordance with well-known practice for the desired operating voltage and frequency range of the device as a microwave amplifier or oscillator. In general, the lower the number of carriers, the higher the frequency range, and the N− region must be the criterion thick enough for sufficient back bias to be applied across the junction formed with the N− layer to produce avalanching without the depletion layer extending into the N+ layer.

The N− surface is then coated with a layer of platinum by exposure to a heated source of platinum in a vacuum, in accordance with well-known practice, to produce vapor deposition of the platinum on the surface of the N− layer. The thickness of the platinum layer is controlled by the length of time of exposure to the heated platinum source and preferably is around 0.4 microns thick. Thinner layers may have pinholes in the layer, whereas thicker layers result in an increase in thermal resistance through the layer.

The platinum surface then has the heat sink 10 plated thereon by immersing the wafer in any desired conventional gold plating solution and applying an appropriate voltage between the platinum layer 12 and an electrode immersed in the solution, in accordance with well-known practice. Heat sink 10 may be of any desired thickness and is shown by way of example as 7 to 10 mils thick. As used through the specification and the claims, the term "heat sink" is meant to include the solid regions of material having a higher thermal conductivity than the semiconductor region and through which heat, generated during operation of the device, is conducted away from the semiconductor region.

A portion of the wafer on the opposite side of the heat sink 10 is removed by lapping or etching, for example with a solution of $H_2SO_4$, $H_2O_2$ and $H_2O$ to thin the wafer, since the original wafer is sufficiently thick to avoid breaking the wafer during the initial processing described above while the finished thickness of the N+ region of the wafer is made as thin as practicable to reduce its resistance and thereby improve the efficiency and gain of the device. In the embodiment illustrated herein, the thickness of the semiconductor body 11 is not substantially greater than 10 microns, but the use of other materials or carrier concentrations could result in greater or lesser optimum thickness of the body 11.

The N+ surface of the wafer is then coated with a layer of platinum in a similar manner to the formation of layer 12. The thickness of the platinum layer 13 may be somewhat thinner than the layer 12 since its junction characteristics are of substantially less importance although it is desirable that there be no pinholes in the layer, and preferably layer 13 is on the order of 0.3 microns thick. A layer of gold approximately 0.5 microns thick is deposited over the platinum layer 13 by a similar vacuum deposition process to that used to form layers 12 and 13. The gold layer 14, as well as the heat sink 10, provides good electrical distribution of the input DC supply voltage across the semiconductor body during operation of the device.

A mask is formed on the top of layer 14 by conventional photoresist techniques, to expose the areas where the body 11 and the layers 12, 13 and 14 are to be removed. These layers are then removed by subjecting the wafer successively to appropriate etchants which etch the materials in accordance with well-known practice. The mask is then removed and the wafer diced to form a number of individual structures like that shown in FIG. 1.

An electrical contact made to one region of the layer 14, for example as shown by the wire 15. The heat sink 10 is attached to a base 17 which is preferably of metal and to which is bonded on envelope 18 of glass or ceramic through which lead 15 is connected by a metal lead-in member 19. Leadin member 19 may be, for example, a hollow tube with wire 15 fed through the tube and attached to the outer end thereof, for example by a solder seal 20.

DESCRIPTION OF SYSTEMS EMBODYING THE INVENTION

Figure 4:
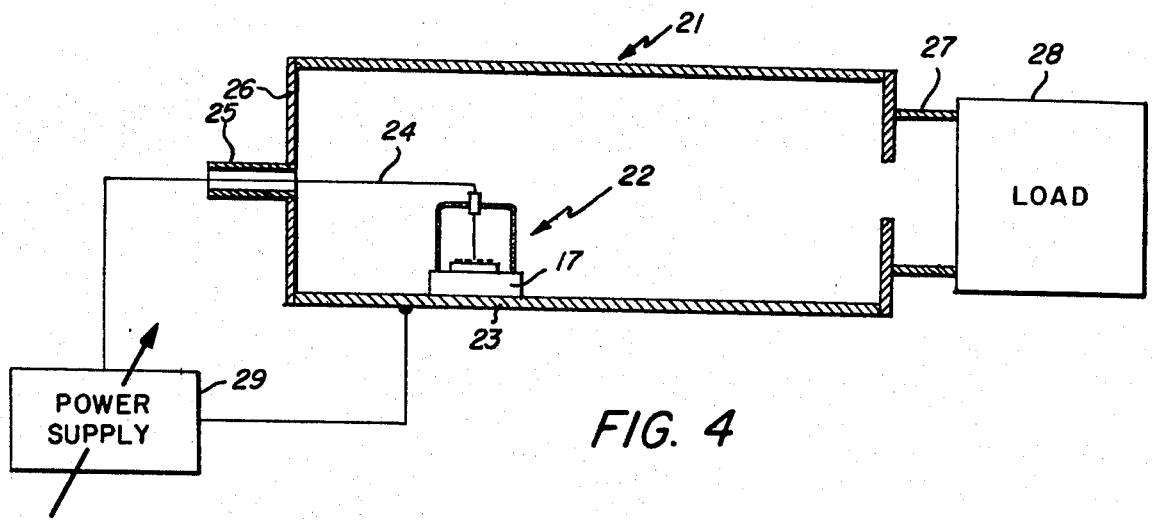
FIG. 4 illustrates an embodiment of the invention showing the device of FIG. 1, 2 and 3 operated as an oscillator coupled to a load.

Referring now to FIG. 4, there is shown a system in which the device of FIGS. 1 through 3 is used. Waveguide 21 has positioned therein device 22 which may be of the type illustrated in FIGS. 1, 2 and 3. The base 17 of the device 22 is attached to the lower wall 23 of the waveguide, and the lead-in member 19 is connected to a conductor 24 which extends through a microwave choke 25 in an end plate 26 of waveguide 21 to provide a path for the application of input power from a DC power source 26. Source 26 is preferably of the adjustable constant current type and adjust the operating power level of the device. Supply 26, may, if desired, be a pulsed or intermittent current supply to produce pulsed microwave energy output from the device.

The other end of the waveguide 21 has a microwave coupling structure, such as, for example, an iris 27 which couples the waveguide 21 to a load 28. Load 28 may be, for example, an antenna structure or the interior of a cavity to be supplied which microwave energy to heat a body positioned therein.

The spacing of the device 22 from the end plate 26 is determined by the relative impedances of the microwave source 22 and the load 28 to which device 22 is coupled. The device 22 has an impedance on the order of 10 ohms which is lower than most types of loads 28. Acccordingly, device 22 is spaced substantially less than a quarter wavelength, at the operating frequency of the system, from the end plate 26, whereas the load 28, which will normally have a higher impedance than device 22, is spaced a greater distance than the device 22, but preferably less than a quarter wavelength, from the end plate 26. It is contemplated that any desired impedance matching structure such as broad band impedance matching structure can be substituted for the impedance matching structure illustrated herein.

Figure 5:
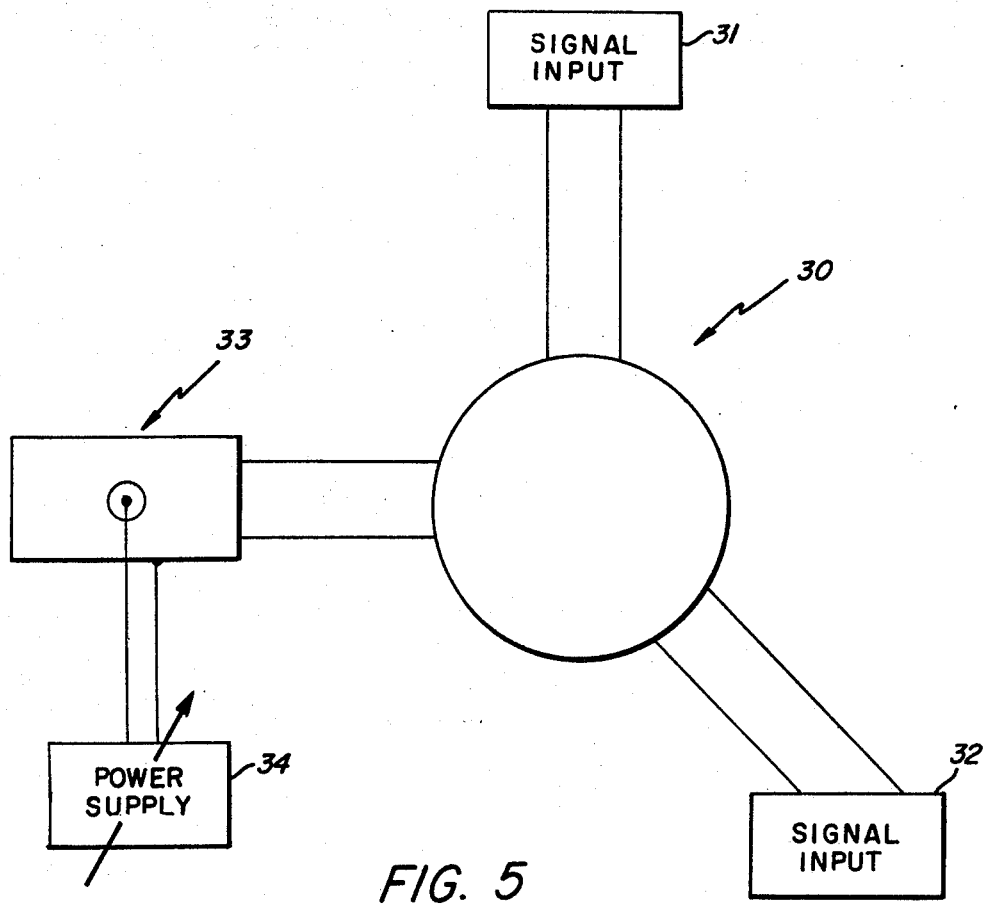
FIG. 5 illustrates an embodiment of the invention in a system for amplifying an external microwave signal.

Referring now to FIG. 5, there is shown an amplifier embodying the invention in which a conventional three-port circulator at 30 has a signal input 31 coupled to a first terminal, a signal load 32 coupled to a second terminal and a device 33 of the type described in FIGS. 1 through 3 coupled through any desired impedance matching structure to a third terminal. A signal from the signal input terminal 31 is coupled to the terminal 33, amplified by the semiconductor device and coupled to the output signal load 32, whereas any small reflections of signals from the load 32, due for example to misadjustment of the impedance match of load 32 to the circulator 30, are coupled back to the impedance matched signal imput 30 and absorbed thereby. Current is supplied to the device 33 by a variable current power supply 34, and preferably the current is adjusted to a level just below that at which oscillations would occur, in the absence of an input signal, in order to achieve maximum amplification of input signals.

This completes the description of the embodiments of the invention illustrated herein. However, many modifications thereof will be apparent to persons skilled in the art without departing from the spirit and scope of this invention. For example the same heat sink can be used for Gunn type amplifiers or oscillators. Accordingly, it is intended that this invention not be limited to the particular details of the embodiments illustrated herein except as defined by the appended claims.

What is claimed is:

1. In combination:
    a plurality of bodies of semiconductor material, each of said bodies having an elongated region for producing charge carrier multiplication or density variation, the width of said region in a direction substantially transverse to the average direction of motion of said carriers being less than ten times the thickness of said region;
    a heat sink thermally coupled to said region of each of said bodies, said heat sink being substantially wider than said width, heat flow away from said bodies having a substantial component parallel to the surface of said heat sink;
    a conductive grid coupled to the side of each of said bodies opposite said heat sink operatively connecting said bodies in parallel;
    oscillations produced by said charge carrier multiplication being coupled to a load; and
    said bodies being arranged in an array of rows and columns upon said heat sink.

2. The combination in accordance with claim 1 wherein a signal to be amplified is coupled into said semiconductor region through a circulator.

3. The combination in accordance with claim 2 wherein the amplified signal is coupled out of said semiconductor region through said circulator.

4. The combination in accordance with claim 1 wherein a voltage is applied across a junction adjacent said region in the reverse direction of sufficient magnitude to produce carrier multiplication in said semiconductor region.

5. The combination in accordance with claim 4 wherein said junction is formed by a metal contact with said semiconductor material.

6. The combination in accordance with claim 5 wherein said semiconductor material extends in at least one direction along said junction for a distance substantially greater than ten times the thickness of said region.

7. The combination in accordance with claim 6 wherein said heat sink is formed of a body the major portion of which has a higher thermal conductivity than the metal forming said junction.

8. The combination in accordance with claim 7 wherein said semiconductor material comprises gallium arsenide and wherein said semiconductor material comprises at least two adjacent regions of the same conductivity type, the carrier concentration in the one of said regions nearest said heat sink being less than that of the one of said regions adjacent said one of said regions nearest said heat sink.

9. The combination in accordance with claim 8 wherein said metal forming said junction with said gallium arsenide comprises platinum.

10. The combination in accordance with claim 9 wherein said carrier multiplication region has a carrier concentration in the range of $10^{14}$ to $5 \times 10^{17}$ carriers per cubic centimeter.

11. The combination in accordance with claim 10 wherein said heat sink comprises gold.

12. The combination in accordance with claim 11, and means for coupling microwave energy out of said region.

* * * * *

UNITED STATES PATENT OFFICE
CERTIFICATE OF CORRECTION

Patent No. 3,965,437   Dated   June 22, 1976

Inventor(s)  Chung Kyu Kim

It is certified that error appears in the above-identified patent and that said Letters Patent are hereby corrected as shown below:

Column 5, line 37:   change "on" to -- an --;

Column 5, line 39:   change "Leadin" to -- Lead in --; and

Column 6, line 26:   change "imput" to -- input --.

Signed and Sealed this

Sixth Day of September 1977

[SEAL]

*Attest:*

RUTH C. MASON
*Attesting Officer*

LUTRELLE F. PARKER
*Acting Commissioner of Patents and Trademarks*